(12) United States Patent
Chinitz et al.

(10) Patent No.: US 10,897,319 B2
(45) Date of Patent: Jan. 19, 2021

(54) INTEGRATED WIRELESS COMMUNICATION TEST ENVIRONMENT

(71) Applicant: Octoscope Inc., Littleton, MA (US)

(72) Inventors: Leigh Chinitz, Wellesley, MA (US); Fanny Mlinarsky, Bolton, MA (US)

(73) Assignee: OCTOSCOPE INC., Littleton, MA (US)

(*) Notice: Subject to any disclaimer, the term of this patent is extended or adjusted under 35 U.S.C. 154(b) by 0 days.

(21) Appl. No.: 16/515,721

(22) Filed: Jul. 18, 2019

(65) Prior Publication Data
US 2020/0028601 A1    Jan. 23, 2020

Related U.S. Application Data

(60) Provisional application No. 62/699,878, filed on Jul. 18, 2018.

(51) Int. Cl.
| H04B 17/17 | (2015.01) |
| H04W 24/06 | (2009.01) |
| H04B 17/00 | (2015.01) |
| H01Q 3/26  | (2006.01) |

(52) U.S. Cl.
CPC ............ *H04B 17/17* (2015.01); *H01Q 3/267* (2013.01); *H04B 17/0085* (2013.01); *H04W 24/06* (2013.01)

(58) Field of Classification Search
CPC .... H04B 17/17; H04B 17/0085; H01Q 3/267; H04W 24/06
See application file for complete search history.

(56) References Cited

U.S. PATENT DOCUMENTS

| 2013/0033279 A1* | 2/2013 | Sozanski | G01R 29/0821 324/750.27 |
| 2013/0054170 A1* | 2/2013 | Sobajic  | G01R 31/3193 702/82 |
| 2015/0253357 A1* | 9/2015 | Olgaard  | G01R 31/3025 324/750.26 |

* cited by examiner

*Primary Examiner* — Syed Haider
(74) *Attorney, Agent, or Firm* — Intrinsic Law Corp.

(57) ABSTRACT

An apparatus for testing electromagnetic components includes electromagnetically-isolating external walls that define a chamber. An internal wall is attached to one or more of the electromagnetically-isolating external walls to form an internal test instrument chamber and an internal device testing chamber. An internal RF feed-through port passes through the internal wall to electrically couple a test instrument disposed in the internal test instrument chamber to a wireless device-under-test (DUT) disposed in the internal device testing chamber. One or more external RF feed-through ports can pass through one of the electromagnetically-isolating external walls to electrically couple the DUT and/or the test instrument to a second wireless device.

32 Claims, 13 Drawing Sheets

INTEGRATED WIRELESS COMMUNICATION TEST ENVIRONMENT

RELATED APPLICATIONS

This application claims priority to U.S. Provisional Application No. 62/699,878, titled "Integrated Wireless Communication Test Environment," filed on Jul. 18, 2018, which is hereby incorporated by reference.

TECHNICAL FIELD

This application relates to the testing of wireless communication systems and devices, including in controlled test environments involving the interconnection of multiple test environments, and in particular to the integration of test instrumentation and infrastructure into a wireless communication test environment or chamber.

BACKGROUND

Testing of wireless electronics communication products and systems allows for determination of the performance of the communication features of the products and systems. This can permit better design of the wireless components to prevent or minimize the effects of "dead zones" or fade-out or other poor performance problems encountered in many wireless communication systems.

Radio frequency (RF) and similar test chambers have been used, which traditionally comprise a large laboratory-scale anechoic or similar environment to reduce interference and noise from non-test sources such as external environmental sources. These environments are costly, cannot be transported, and lack other flexible features modern test environments could benefit from.

Present systems for designing and testing of wireless products lack flexibility, are too costly to make and operate, take up too much space, and generally cannot flexibly permit the testing of the variety and number of devices as described herein.

In addition, complicated wireless test scenarios can require a large number of auxiliary test equipment such as sniffers, monitors, or packet or interference generators. These devices can serve to further increase the size of the system, and they can also take up valuable connection capacity that would otherwise be used for interconnecting the wireless test equipment.

An example of an existing test chamber 10 is illustrated in FIG. 1. The test chamber 10 includes a plurality of electromagnetically-isolating walls that define an electromagnetically-isolated internal testing volume 100 to test one or more devices under test (DUTs) 110. The DUT 110 is in wireless electrical signal communication with one or more auxiliary test instruments, such as packet sniffer 120, RF interference generator 130, and/or traffic endpoint 140 (e.g., via a wireless connection or via a combination of wireless and wired connections to the auxiliary test instruments). The packet sniffer 120 can capture packets as the DUT 110 communicates with the traffic endpoint 140, which acts as the other end of a wireless connection. The RF interreference generator 130 can generate RF signals that modify the electromagnetically-isolated internal testing volume 100 in a controlled way.

The packet sniffer 120, RF interference generator 130, and traffic endpoint 140 are each electrically coupled through wired connection to one or more RF feed-through ports 150 that pass through the electromagnetically-isolating walls of the test chamber 10. The RF feed-through ports 150 are further connected via electrically-shielded coaxial cables 160 to respective antennas 170 in the testing volume 100 to communicate with the DUT 110.

As can be seen, the test chamber 10 needs three or more RF feed-through ports 150 in order to electrically couple the packet sniffer 120, RF interference generator 130, and the traffic endpoint 140 to the DUT 110. In complex test scenarios, the test chamber 10 is electrically coupled to additional test chambers using additional RF feed-through ports 150. For example, in a mesh test configuration 20, each test chamber 10 is electrically coupled to every other test chamber, as illustrated in FIG. 2.

In addition, each external device (e.g., packet sniffer 120, RF interference generator 130, traffic endpoint 140) connected to the test chamber 10 needs to be individually electromagnetically shielded to avoid introducing electromagnetic interference into the test chamber 10. This adds to the cost, size, weight, and complexity of the testing environment.

It would be desirable to overcome one or more of these and/or other problems.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to an apparatus for testing wireless devices, comprising: electromagnetically-isolating external walls that define a chamber; an internal wall attached to one or more of the electromagnetically-isolating external walls to form an internal test instrument chamber and an internal device testing chamber; and an internal RF feed-through port that passes through the internal wall to electrically couple a test instrument disposed in the internal test instrument chamber to a wireless device-under-test (DUT) disposed in the internal device testing chamber.

In one or more embodiments, the apparatus further comprises an external RF feed-through port that passes through one of the electromagnetically-isolating external walls to electrically couple the DUT to a second wireless device. In one or more embodiments, the external RF feed-through port is disposed on a perimeter of the internal device testing chamber. In one or more embodiments, the electromagnetically-isolating external walls comprise an electrically-conductive material. In one or more embodiments, the electrically-conductive material comprises steel.

In one or more embodiments, the internal and external RF feed-through ports are electrically coupled to respective antennas in the internal device testing chamber. In one or more embodiments, the test instrument comprises a packet sniffer. In one or more embodiments, the test instrument comprises a traffic endpoint. In one or more embodiments, the test instrument comprises an RF interference generator.

In one or more embodiments, the apparatus further comprises an access door disposed on one of the electromagnetically-isolating external walls. In one or more embodiments, the test instrument is electrically coupled to an external RF feed-through port that passes through one of the electromagnetically-isolating external walls on a perimeter of the internal test instrument chamber to electrically couple the test instrument to a second wireless device. In one or more embodiments, the internal wall is electromagnetically-isolating. In one or more embodiments, an RF absorber is disposed on interior surfaces of the internal device testing chamber. In one or more embodiments, the internal wall is detachably attached to the one or more of the electromagnetically-isolating external walls.

Another aspect of the invention is directed to a system for testing wireless devices, comprising: a first apparatus and a second apparatus. The first apparatus comprises first electromagnetically-isolating external walls that define a first chamber; an internal wall attached to one or more of the first electromagnetically-isolating external walls to form an internal test instrument chamber and an internal device testing chamber; an internal wall RF feed-through port that passes through the internal wall to electrically couple a test instrument disposed in the internal test instrument chamber to a first wireless device disposed in the internal device testing chamber; and a first external wall RF feed-through port that passes through one of the electromagnetically-isolating external walls on a perimeter of the internal test instrument chamber. The second apparatus comprises second electromagnetically-isolating external walls that define a second chamber; and a second external wall RF feed-through port that passes through one of the second electromagnetically-isolating external walls. The test instrument is in electrical communication with the first wireless device via the internal wall RF feed-through port. In addition, the test instrument is in electrical communication with a second wireless device in the second chamber via the first and second external wall RF feed-through ports.

In one or more embodiments, the second apparatus includes a second internal wall attached to one or more of the second electromagnetically-isolating external walls to form a second internal test instrument chamber and a second internal device testing chamber. In one or more embodiments, the test instrument is electrically coupled to the internal wall RF feed-through port and to the first external wall RF feed-through port via a combiner. In one or more embodiments, the electromagnetically-isolating external walls comprise an electrically-conductive material. In one or more embodiments, the electrically-conductive material comprises steel.

In one or more embodiments, the internal wall RF feed-through port is electrically coupled to an antenna in the internal device testing chamber. In one or more embodiments, the test instrument comprises a packet sniffer. In one or more embodiments, test instrument comprises a traffic endpoint. In one or more embodiments, the test instrument comprises an RF interference generator.

In one or more embodiments, the internal wall is electromagnetically-isolating. In one or more embodiments, an RF absorber is disposed on interior surfaces of the internal device testing chamber and on interior surfaces of the second electromagnetically-isolating external walls. In one or more embodiments, the internal wall is detachably attached to the one or more of the first electromagnetically-isolating external walls. In one or more embodiments, an electrically-shielded coaxial cable extends between the first and second external wall RF feed-through ports. In one or more embodiments, n the electrically-shielded coaxial cable is electrically coupled to a programmable attenuator.

Yet another aspect of the invention is directed to a method of wireless device testing comprising: placing a first wireless device in a chamber having electromagnetically-isolating external walls; placing a testing device in the chamber; testing a wireless device-under-test (DUT), wherein the DUT is in electrical communication with the first wireless device or the DUT comprises the first wireless device; and collecting test data with the testing device, the test data corresponding to wireless signals sent to and/or from the first wireless device during the testing.

In one or more embodiments, the method further comprises placing the testing device in an internal test instrument chamber defined by an internal wall attached to one or more of the electromagnetically-isolating external walls. In one or more embodiments, the method further comprises, prior to placing the testing device in the internal test instrument chamber, removing the internal wall to access the internal test instrument chamber. In one or more embodiments, the method further comprises, prior to placing the testing device in the internal test instrument chamber, opening an access door to access the internal test instrument chamber, the access door disposed on the internal wall or the one or more of the electromagnetically-isolating external walls. In one or more embodiments, the first wireless device comprises the DUT. In one or more embodiments, the DUT is located in a second chamber having electromagnetically-isolating external walls.

BRIEF DESCRIPTION OF THE DRAWINGS

For a fuller understanding of the nature and advantages of the present concepts, reference is made to the following detailed description of preferred embodiments and to the accompanying drawings.

DETAILED DESCRIPTION

One or more auxiliary testing instruments is/are disposed in an electromagnetically-isolating chamber to reduce the number of RF feed-through ports needed to wirelessly couple the auxiliary testing instrument(s) to a first wireless device located in the electromagnetically-isolating chamber. The first wireless device can be a wireless device-under-test (DUT) or another wireless device in electrical communication with the DUT. In addition, locating the auxiliary testing instrument(s) in the electromagnetically-isolating chamber reduces or eliminates the need to individually electromagnetically-shield the auxiliary testing instrument(s) since the electromagnetically-isolating chamber can function as the electromagnetic shield.

In some embodiments, an internal wall (or internal walls) can define an internal test instrument chamber and an internal device testing chamber within the electromagnetically-isolating chamber. The auxiliary testing instrument(s) is/are located in the internal test instrument chamber and the first wireless device is located in the internal device testing chamber. Internal RF feed-through ports through one of the internal walls can provide a wired connection between the auxiliary testing instrument(s) in the internal test instrument chamber and corresponding antennas in the internal device testing chamber. This allows the auxiliary testing instrument(s) to be in wireless communication (via the antennas) with the first test instrument.

In some embodiments, the auxiliary testing instrument(s) can be connected to both an internal feed-through port(s) and an external feed-through port(s). The internal feed-through port(s) can connect the auxiliary testing instrument(s) in the internal test instrument chamber to the first wireless device in the internal device testing chamber, as discussed above. The external feed-through port(s) can connect the auxiliary testing instrument(s) in the internal test instrument chamber to a second wireless device located in a second electromagnetically-isolating chamber.

Figure 1:
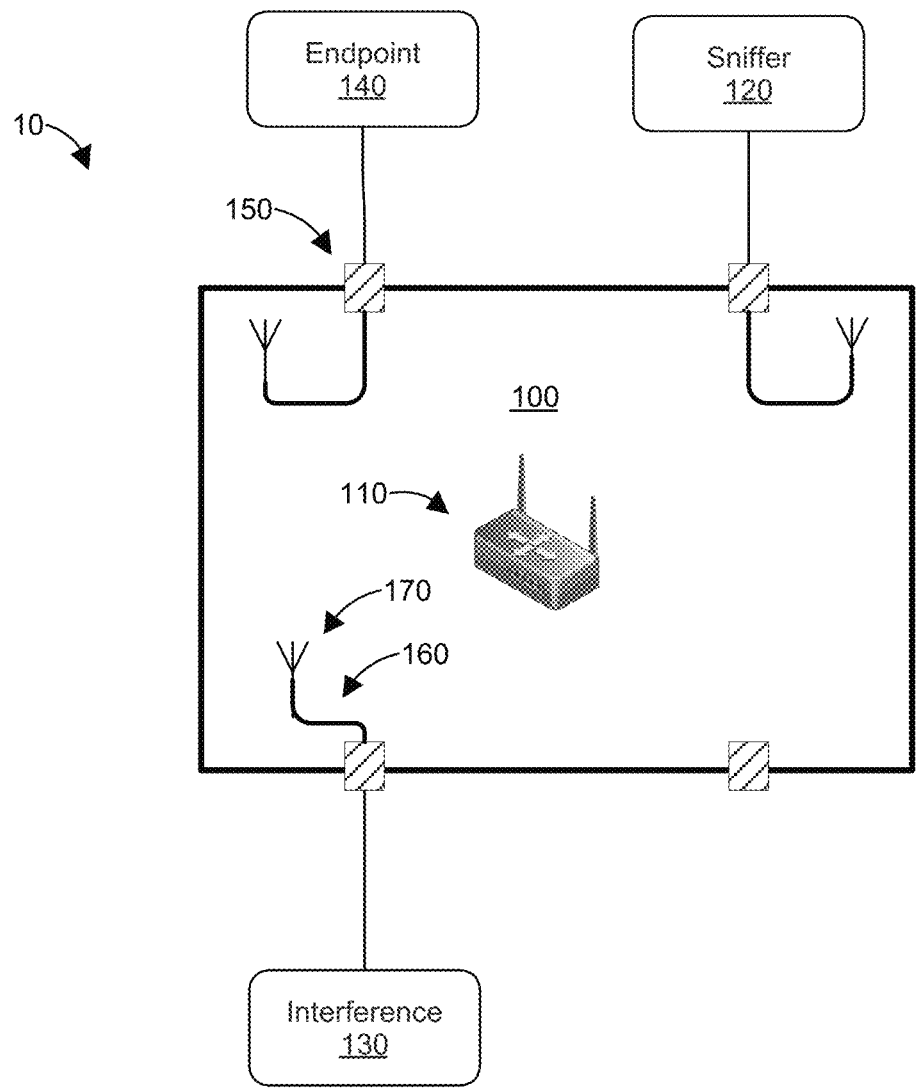
FIG. 1 is a block diagram of a test chamber according to the prior art.
Figure 2:
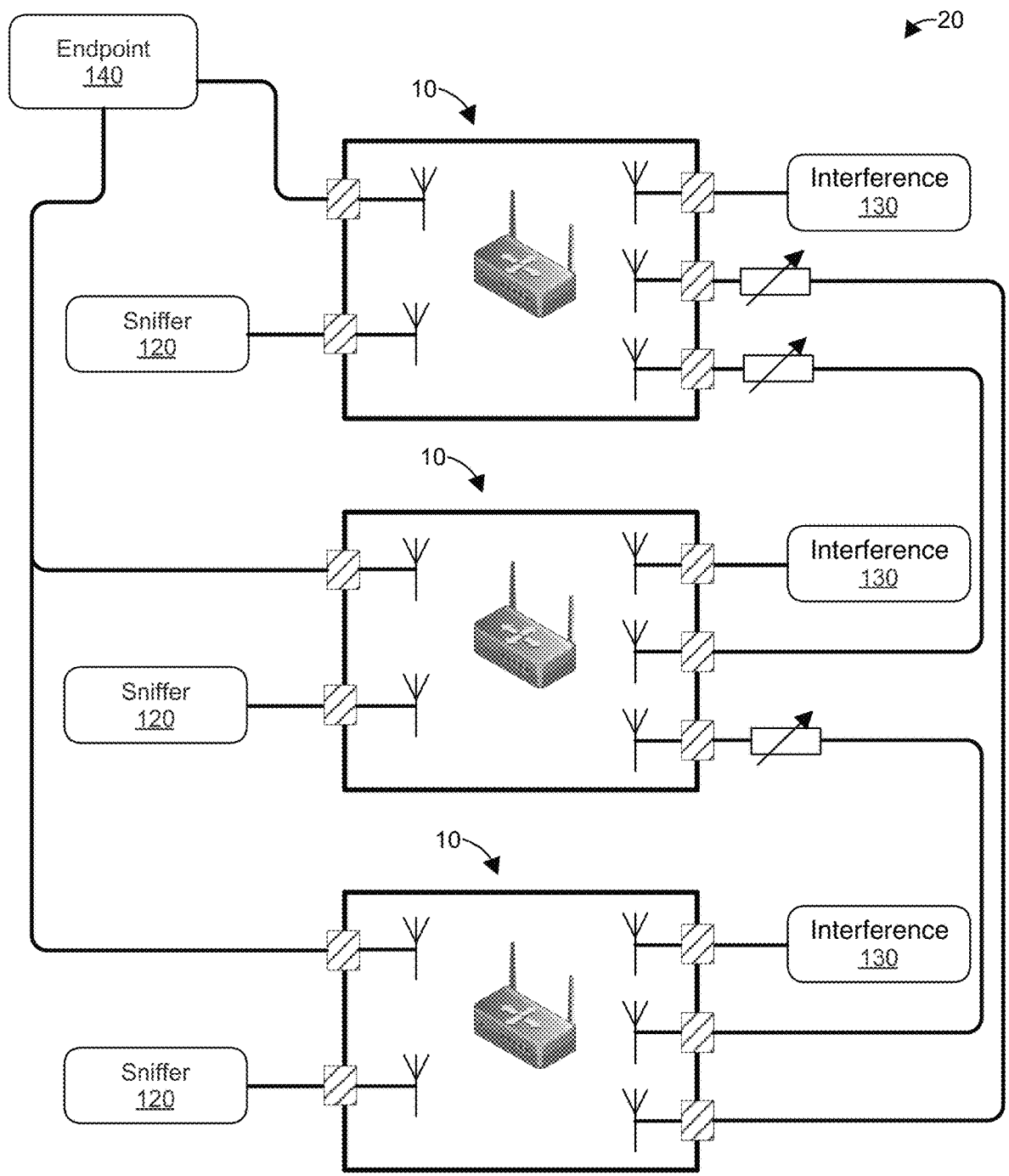
FIG. 2 is a block diagram of a mesh test configuration of test chambers according to the prior art.
Figure 3:
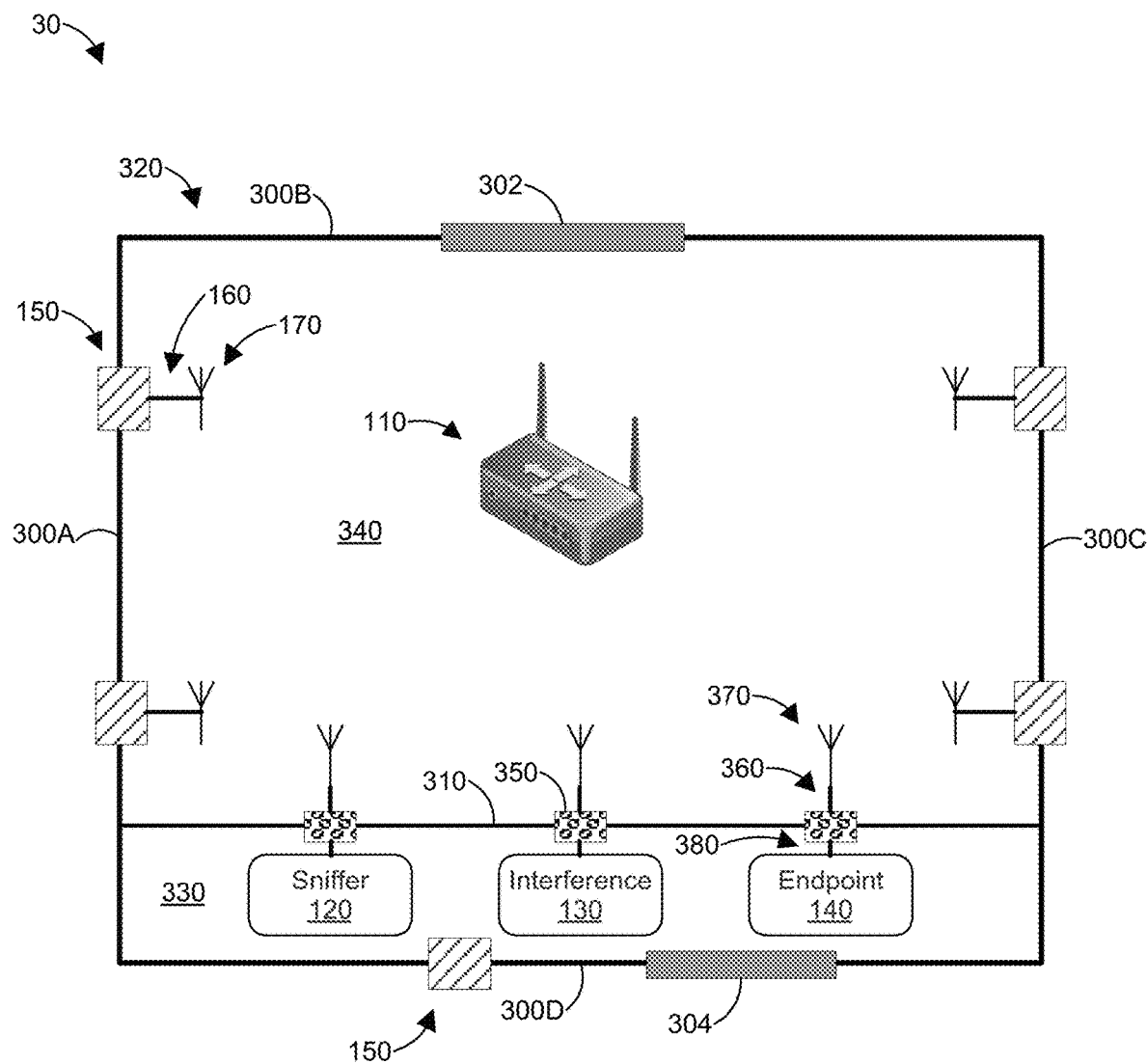
FIG. 3 is a block diagram of an integrated test system according to one or more embodiments.
Figure 12:
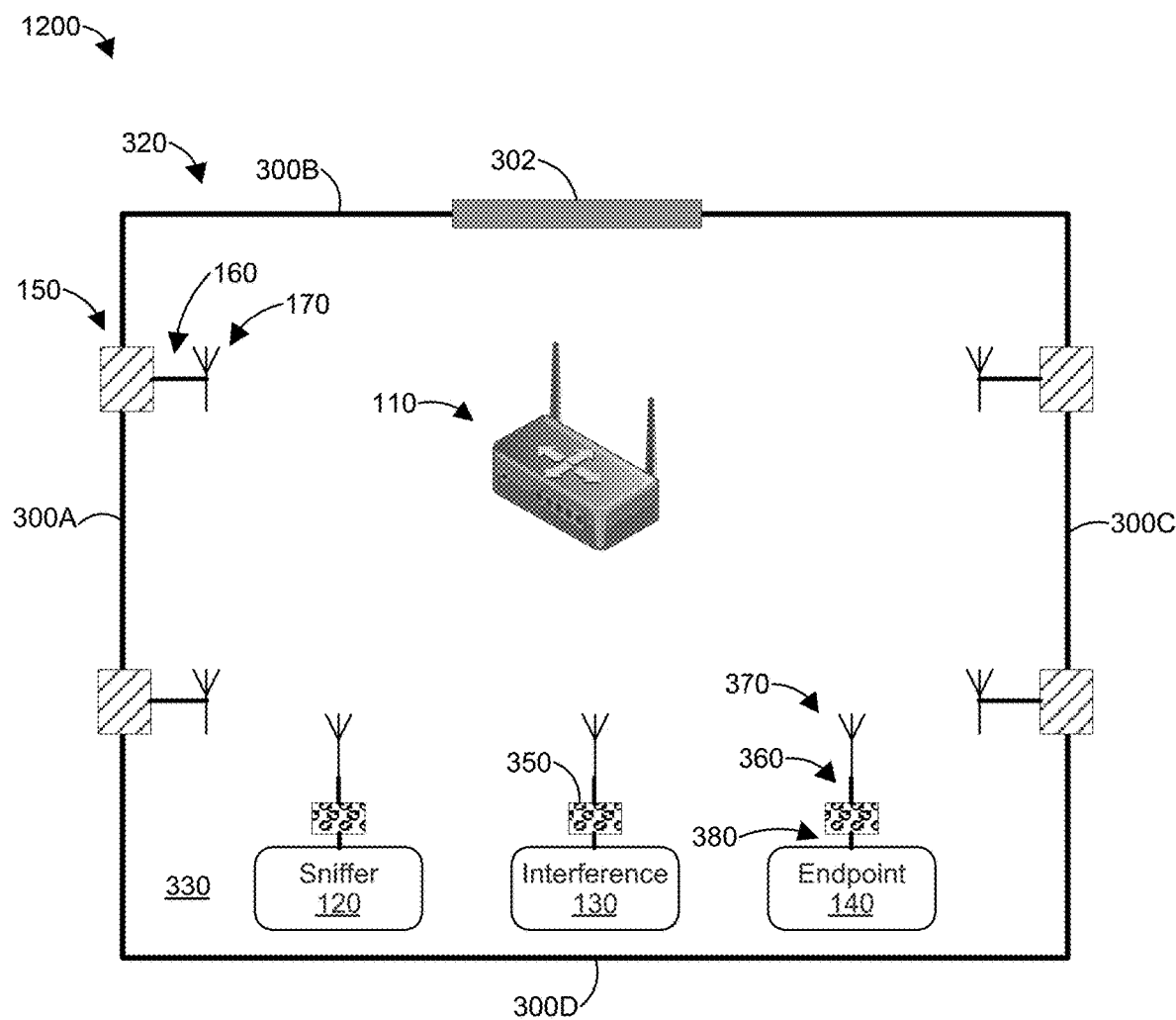
FIG. 12 is a block diagram of an integrated test apparatus according to an alternative embodiment.

FIG. 3 is a block diagram of an integrated test apparatus 30 according to one or more embodiments. The integrated test apparatus 30 includes electromagnetically-isolating external walls 300A-D (in general, 300) and an optional internal wall 310. The electromagnetically-isolating external walls 300 form a chamber 320 having an internal volume. The internal wall 310 is attached to opposing electromagnetically-isolating external walls 300A, 300C to form an internal test instrument chamber 330 and an internal device testing chamber 340. The internal wall 310 can be electromagnetically-isolating in some embodiments. In some embodiments, the internal wall 310 is not included for example as illustrated in integrated test apparatus 1200 in FIG. 12.

The internal test instrument chamber 330 is formed by the internal wall 310, the electromagnetically-isolating external wall 300D, and first portions of electromagnetically-isolating external walls 300A, 300C. The internal test instrument chamber 330 is configured and arranged to receive one or more auxiliary test instruments, such as packet sniffer 120 (e.g., a packet capture engine such as a protocol analyzer and/or an RF analyzer), RF interference generator 130, and traffic endpoint 140. The test instruments are separated from the DUT 110 by the internal wall 310. In addition, the test instruments are isolated from external electromagnetic interference (e.g., from outside the integrated test apparatus 30) by the electromagnetically-isolating external wall 300D and the first portions of electromagnetically-isolating external walls 300A, 300C that form the internal test instrument chamber 330. Therefore, the test instruments do not need to be individually electromagnetically shielded as they are shielded by the electromagnetically-isolating external walls 300. This reduces the size, weight, and/or cost of the integrated test apparatus 30.

In some embodiments, one or more external RF feed-through port(s) 150 is/are disposed on the electromagnetically-isolating external wall 300D (and/or the first portions of electromagnetically-isolating external walls 300A, 300C that form the internal test instrument chamber 330) to allow one or more of the test instruments to be electrically coupled to an external device (e.g., a computer, a wireless device or test instrument in another test apparatus 30, etc.). For example, the RF feed-through port(s) 150 can be disposed on a perimeter of the external wall portion of the perimeter of the internal test instrument chamber 330. In the internal test instrument chamber 330, the external RF feed-through port 150 can be coupled to a test device via a wireless connection (e.g., via an antenna 170) and/or a wired connection (e.g., via an electrically-shielded coaxial cable 160 such an RF or coaxial cable).

The internal device testing chamber 340 is formed by the internal wall 310, the electromagnetically-isolating external wall 300B, and second portions of electromagnetically-isolating external walls 300A, 300C. The internal device testing chamber 340 is configured and arranged to receive one or more DUTs 110. The DUT 110 is separated from the test instruments by the internal wall 310. In addition, the DUT 110 is isolated from external electromagnetic interference (e.g., from outside the integrated test apparatus 30) by the electromagnetically-isolating external wall 300D and the second portions of electromagnetically-isolating external walls 300A, 300C that form the internal test instrument chamber 330. In some embodiments, the additional client wireless devices can be disposed in the internal device testing chamber 340. Alternatively, the DUT 110 can be replaced with one or more client wireless devices or with an access point.

An optional first electromagnetically-isolating access door 302 can be disposed on one of the electromagnetically-isolating external walls 300A-C that form the internal device testing chamber 340. The door 302 can be opened to access the internal volume of the internal device testing chamber 340, such as to place or remove the DUT(s) 110 or the antennas 170. The door 302 is closed during testing to electromagnetically isolate the DUT 110 from external electromagnetic signals. An optional second electromagnetically-isolating access door 304 can be disposed on one of the electromagnetically-isolating external walls 300A, C, or D that form the internal test instrument chamber 330. The door 304 can be opened to access the internal volume of the internal test instrument chamber 330, such as to place or remove one or more the test instruments. The door 304 is closed during testing to electromagnetically isolate the test instruments from external electromagnetic signals. In an alternative embodiment, the optional door 304 can be disposed on the internal wall 310. Additionally or alternatively, the internal wall 310 can be removable or pivotable to access the internal volume of the internal test instrument chamber 330.

The electromagnetically-isolating external walls 300, the optional internal wall 310, and the optional electromagnetically-isolating access doors 302, 304 can be formed out of electrically-conductive materials such as metals or metal alloys (e.g., steel).

The interior surfaces of the internal test instrument chamber 330 and of the internal device testing chamber 340 can be substantially or partially anechoic (e.g., semi-anechoic) so as to absorb or minimize the internal reflection of electromagnetic waves incident upon the interior surfaces of the electromagnetically-isolating external walls 300, upon the internal wall 310, and/or upon the electromagnetically-isolating access doors 302, 304. For example, the interior surfaces of the internal test instrument chamber 330 and of the internal device testing chamber 340 can be covered with an RF absorber to reduce internal RF reflections from the walls 300, 310. The RF absorber are preferably selected to reduce the internal RF reflections as much as practicable. An example of an RF absorber is Cummings Microwave LF77 RF absorptive foam available from Cuming Microwave Corporation. In some embodiments, the semi-anechoic internal wall 310 can prevent electromagnetic waves from reflecting off the test instruments, thereby improving the controlled test environment in internal device testing chamber 340.

The test instruments are each electrically coupled to one or more internal RF feed-through ports 350 that pass through the internal wall 310 between internal test instrument chamber 330 and the internal device testing chamber 340. The internal RF feed-through ports 350 are further connected, via electrically-shielded coaxial cables 360, to respective antennas 370 in the internal device testing chamber 340 to communicate with the DUT 110. In the internal test instrument chamber 330, electrically-shielded coaxial cables 380 electrically couple each test instrument (e.g., packet sniffer 120, RF interference generator 130, and traffic endpoint 140) to the one or more internal RF feed-through ports 350. The external and internal RF feed-through ports 150, 350 include a first connection point on a first side of the wall (e.g., electromagnetically-isolating external wall 300 or internal wall 310) and a corresponding second connection point on a second side of the wall. The first and second connection points are in electrical communication with one another so as to enable coupling of an exterior conductor (e.g., a coaxial cable on the first side of the wall) and an interior conductor (e.g., an antenna 170 or an electrically-shielded coaxial cable 160 on the second side of the wall) to the first and second connection points, respectively. Test signals are coupled via the RF feed-through ports 150, 350 to DUT 110 in the internal device testing chamber 340 and to the test instruments in the internal test instrument chamber 330.

Using internal RF feed-through ports 350 to electrically couple the test instruments to the DUT 110 makes more of the external RF feed-through ports 150 available to connect to additional test instruments and/or test chambers, for example in more complex test scenarios such as in mesh test configurations. Therefore, the integrated test apparatus 30 can be manufactured with fewer external RF feed-through ports 150 while maintaining the ability to be configured in more complex test scenarios reduces the cost of the integrated test apparatus 30.

Figure 4:
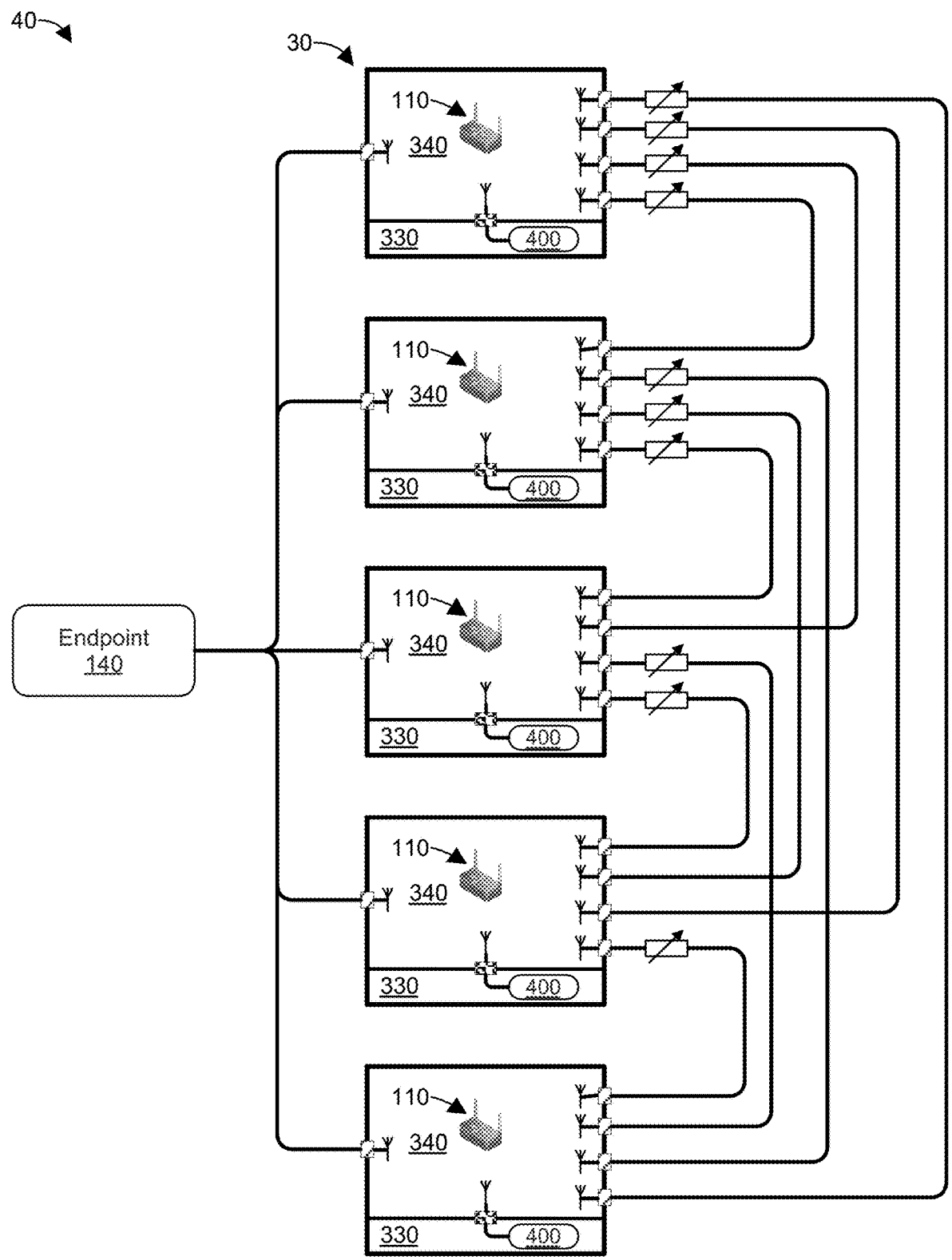
FIG. 4 is a block diagram of a mesh test configuration according to one or more embodiments.

An example of a complex test scenario is illustrated in FIG. 4 as mesh test configuration 40 which includes five interconnected integrated test apparatus 30. Each integrated test apparatus 30 includes an optional internal wall 310 that forms an internal test instrument chamber 330 and an internal device testing chamber 340, as discussed above. The auxiliary test instrument(s) disposed in internal test instrument chamber 330 are represented as auxiliary test instrument(s) 400 in FIG. 4. Auxiliary test instrument(s) 400 can include one or more of the packet sniffer 120, RF interference generator 130, traffic endpoint 140, and/or other auxiliary test instruments.

The benefits of the integrated test apparatus 30, such as reducing the size, weight, and/or cost of the test instruments (e.g., since they do not need to be individually electromagnetically shielded in the internal test instrument chamber 330) and reducing the number of external RF feed-through ports 150 in the internal device testing chamber 340, increases in proportion to the number of integrated test apparatus 30 used (e.g., interconnected) in a given test scenario.

Figure 5:
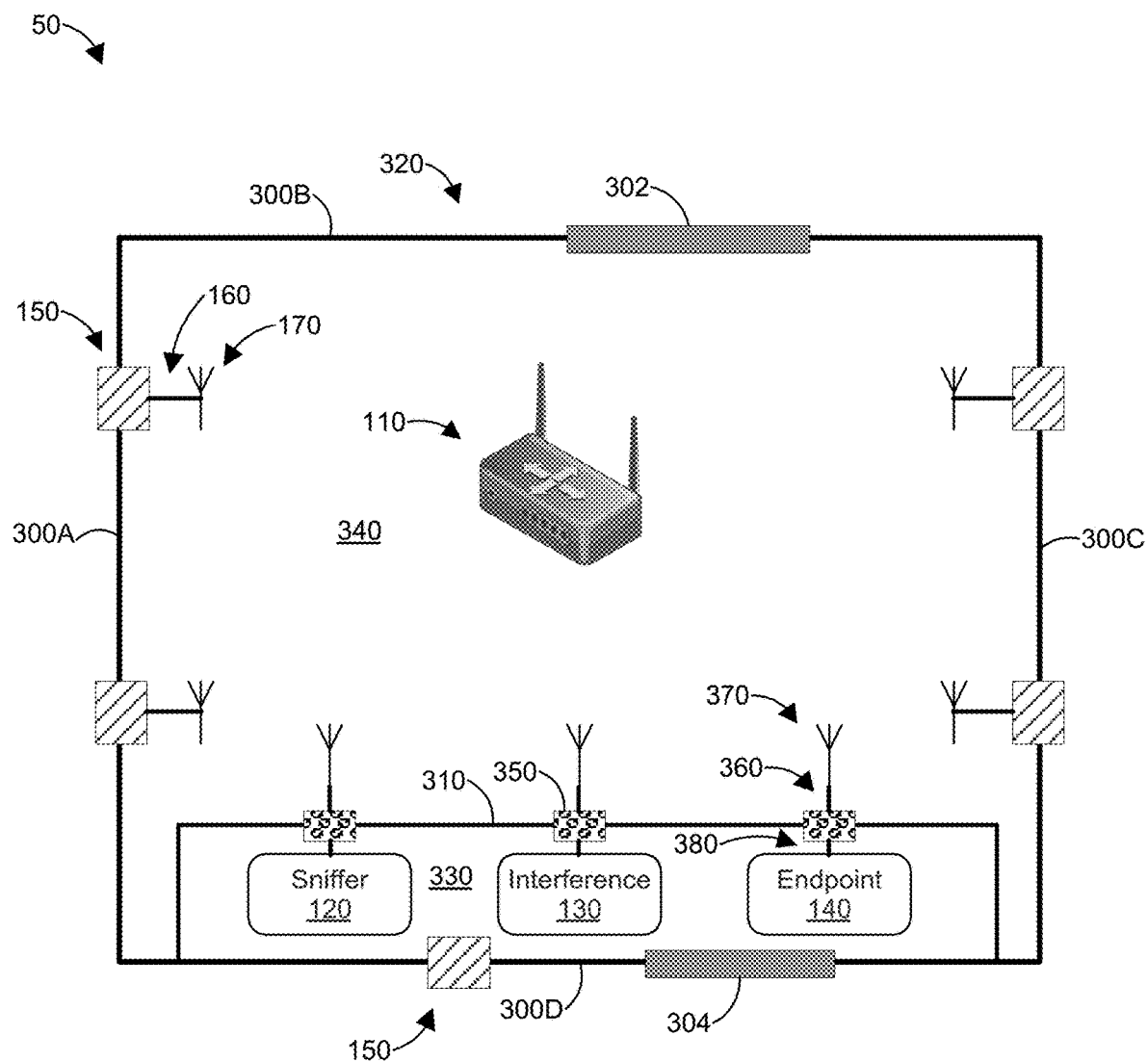
FIG. 5 is a block diagram of an integrated test apparatus according to an alternative embodiment.

FIG. 5 is a block diagram of an integrated test apparatus 50 according to an alternative embodiment. Integrated test apparatus 50 is the same as integrated test apparatus 30 except that in FIG. 5 the internal wall 310 is only attached to electromagnetically-isolating external wall 300D, while in FIG. 3 the electromagnetically-isolating internal wall 310 is attached to electromagnetically-isolating external walls 300A, 300C. Of course, other combinations are possible. For example, in another embodiment, the internal wall 310 can be attached to electromagnetically-isolating external walls 300A, D or to electromagnetically-isolating external walls 300C, D. Other combinations are possible as well.

Figure 6:
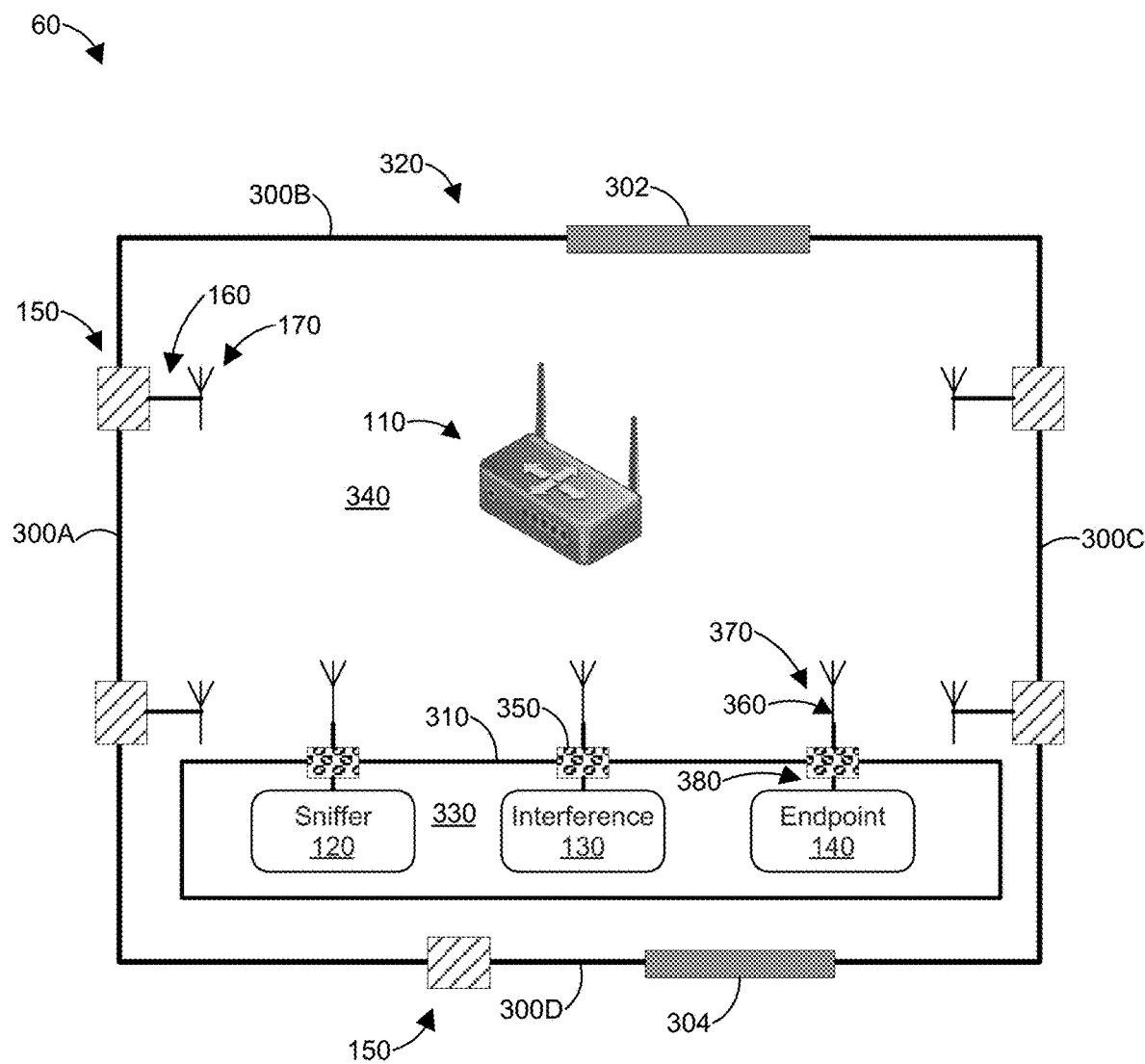
FIG. 6 is a block diagram of an integrated test apparatus according to another alternative embodiment.

FIG. 6 is a block diagram of an integrated test apparatus 60 according to another alternative embodiment. In this embodiment, the internal test instrument chamber 330 is formed entirely by internal walls 310. Otherwise, integrated test apparatus 60 is the same as integrated test apparatus 30.

Figure 7:
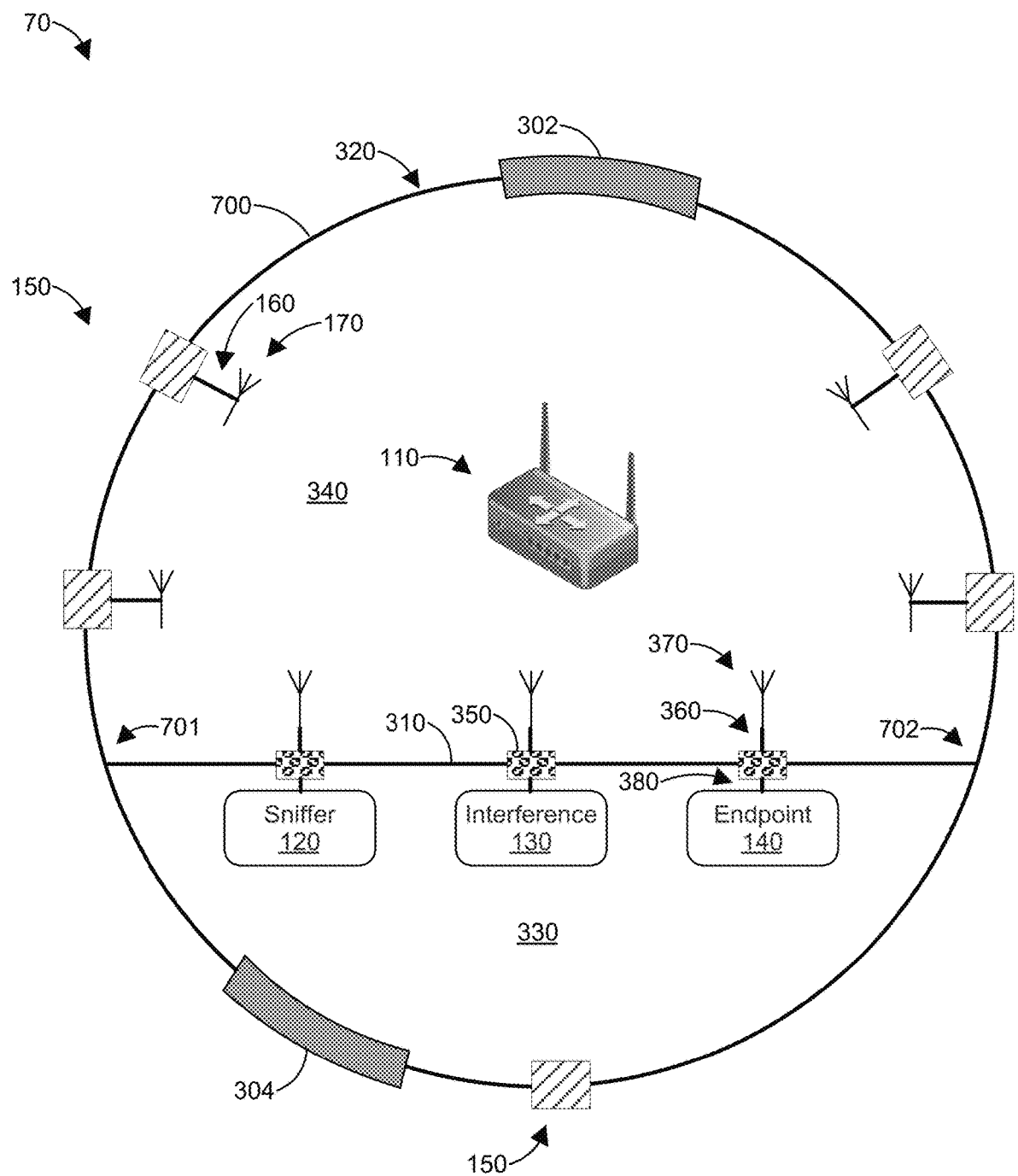
FIG. 7 is a block diagram of an integrated test apparatus according to another alternative embodiment.

FIG. 7 is a block diagram of an integrated test apparatus 70 according to another alternative embodiment. In this embodiment, the chamber 320 has a circular cross-sectional shape (e.g., as a sphere) formed by an electromagnetically-isolating external wall 700 and the internal wall 310 is attached to the electromagnetically-isolating external wall 700 at two locations 701, 702.

Figure 8:
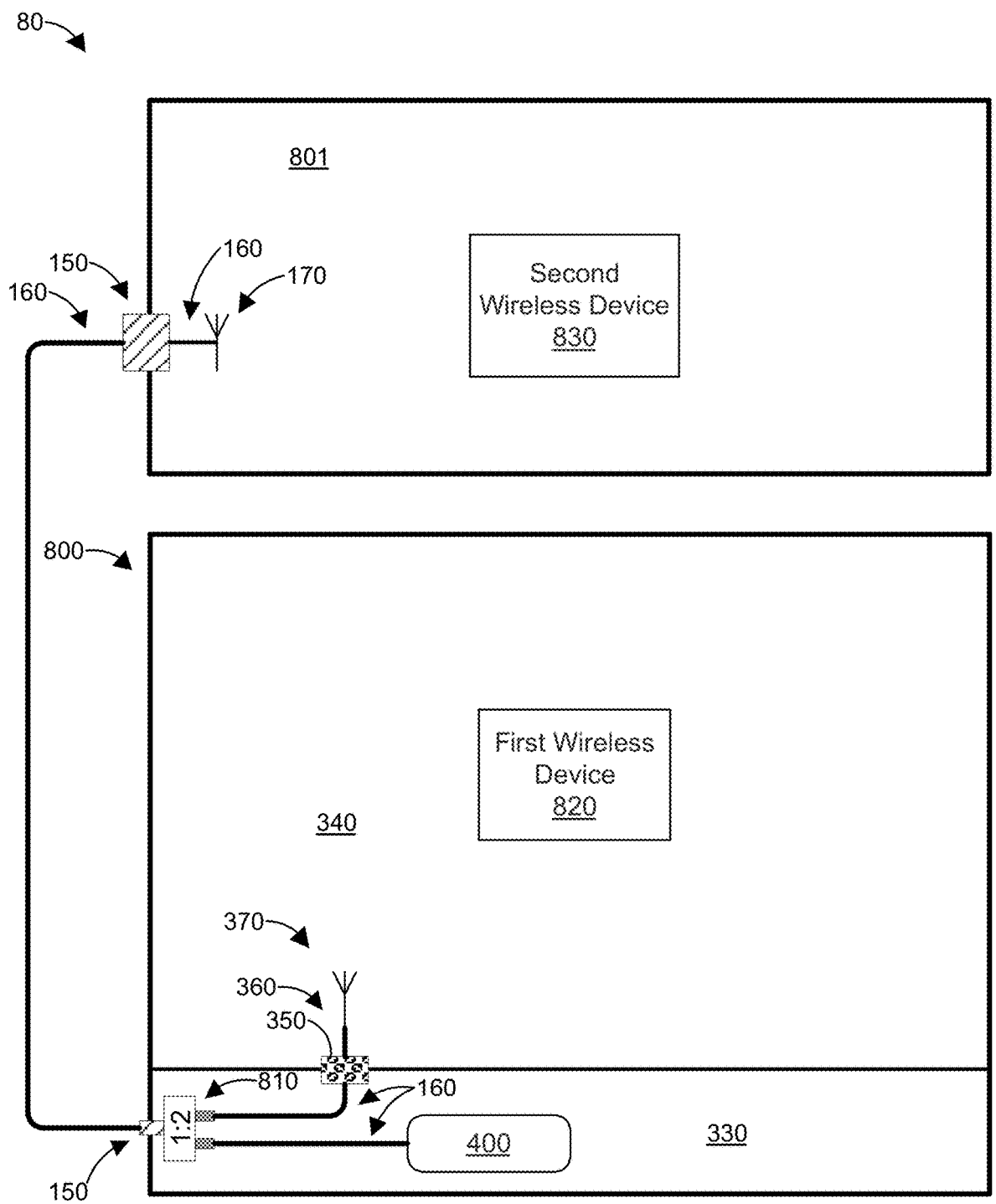
FIG. 8 is a block diagram of a system for testing wireless devices according to one or more embodiments.

FIG. 8 is a block diagram of a system 80 for testing wireless devices according to one or more embodiments. The system 80 includes an integrated test apparatus 800 and a second test apparatus 801. The integrated test apparatus 800 is the same as integrated test apparatus 30 except that the auxiliary test instrument 400 is simultaneously electrically coupled to both an internal RF feed-through port 350 and an external RF feed-through port 150 via electrically-shielded coaxial cables 160 and 1:2 RF cable splitter 810. The external RF feed-through port 150 is located on the external wall perimeter of the internal test instrument chamber 330. Additional external RF feed-through port(s) 150 can be located on the external wall perimeter of the internal device testing chamber 340. The second test apparatus 801 includes external electrically-isolating walls that can be the same as electromagnetically-isolating external walls 300.

The internal RF feed-through port 350 is electrically connected, via an electrically-shielded coaxial cable 360, to an antenna 370 in the internal device testing chamber 340 to wirelessly communicate with a first wireless device 820 disposed therein. The external RF feed-through port 150 in the integrated test apparatus 800 is electrically connected, via an RF cable, to an external RF feed-through port 150 in the second test apparatus 801. The external RF feed-through port 150 in the second test apparatus 801 is electrically connected, via an electrically-shielded coaxial cable 160, to an antenna 170 in the second test apparatus 801 to wirelessly communicate with a second wireless device 830 disposed therein. Thus, the auxiliary test instrument 400 can be in electrical communication (e.g., signal communication) with the first wireless device 820 via the internal RF feed-through port 350 and with the second wireless device 830 via external RF feed-through ports 150 in the integrated test apparatus 800 and in the second test apparatus 801.

Each of the first and second wireless devices 820, 830 can include one or more client devices (e.g., including a DUT), an access point, another wireless device, and/or an endpoint.

In one example, the first wireless device 820 can include a DUT (e.g., DUT 110) and the second wireless device can include an access point. In another example, first wireless device 820 can include an access point and the second wireless device can include a DUT (e.g., DUT 110).

Figure 9:
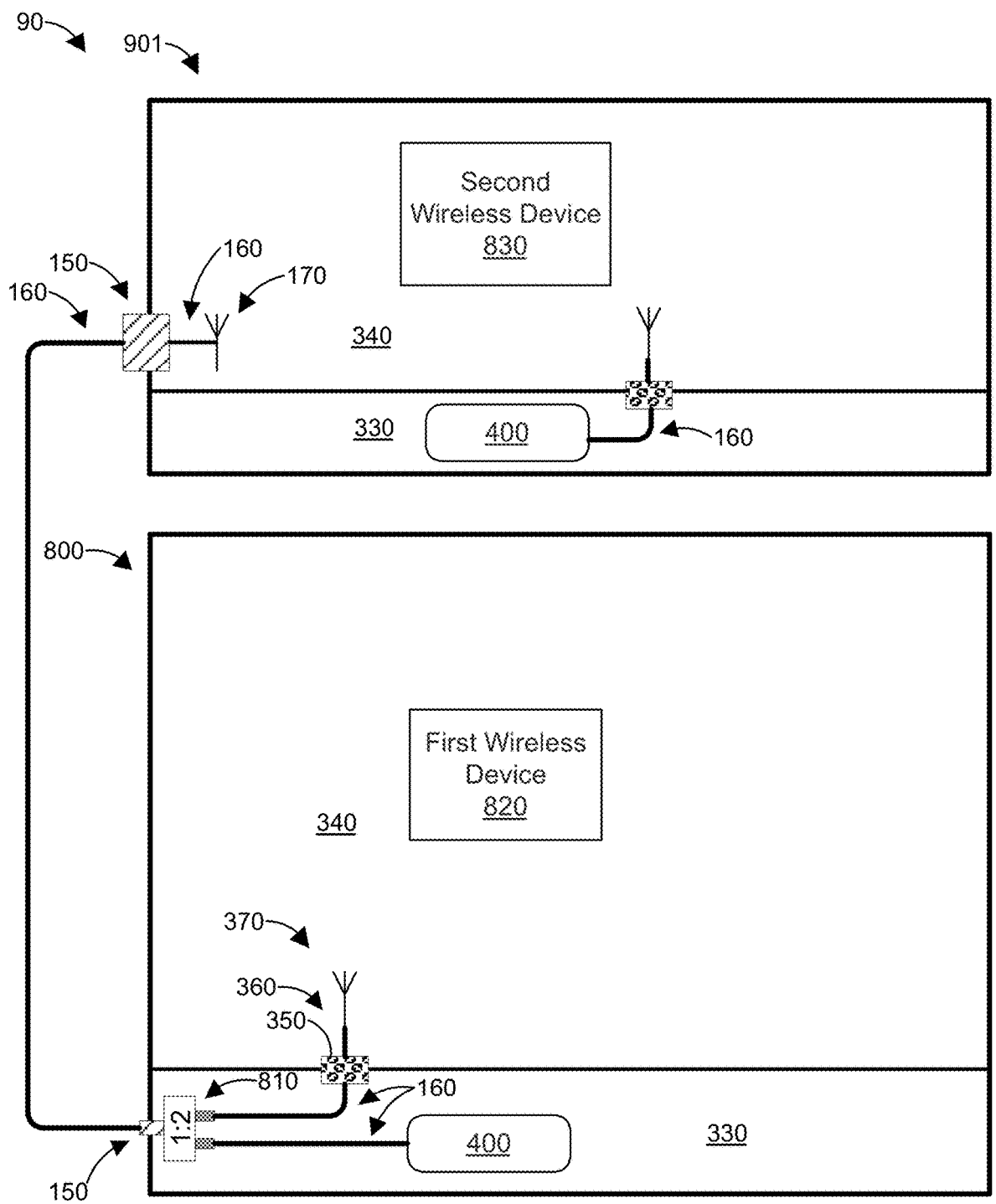
FIG. 9 is a block diagram of a system for testing wireless devices according to an alternative embodiment.

In some embodiments, the second test apparatus 801 can be a second integrated test apparatus 901, as illustrated in system 90 in FIG. 9. The external RF feed-through port 150 in the second integrated test apparatus 901 is positioned on an electromagnetically-isolating external wall of the internal device testing chamber 340 such that the auxiliary test instrument 400 in the first integrated test apparatus 800 is in electrical communication with the second wireless device 830 in the second integrated test apparatus 901.

Figure 10:
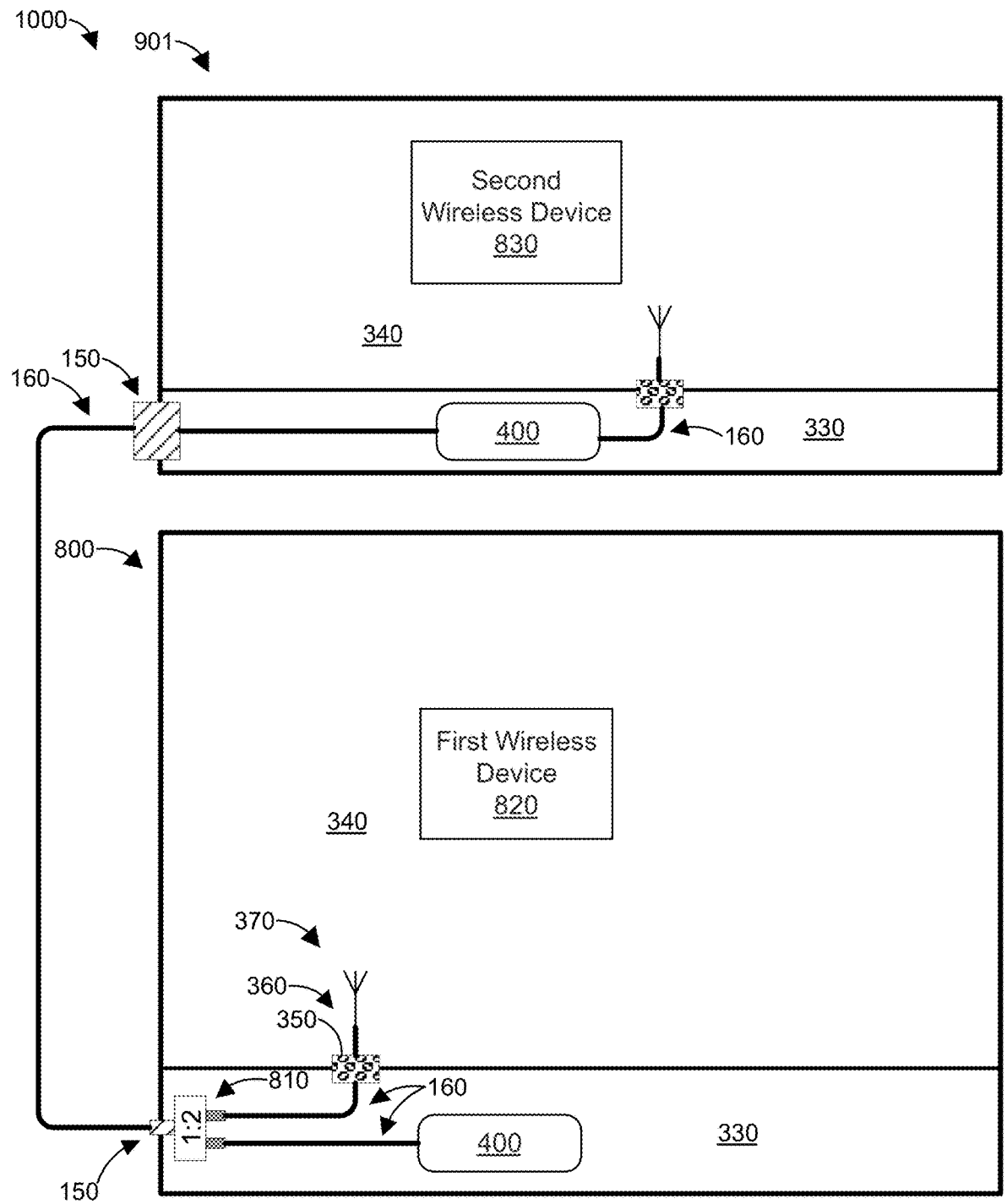
FIG. 10 is a block diagram of a system for testing wireless devices according to another alternative embodiment.

FIG. 10 illustrates an alternative embodiment of a system 1000 where the external RF feed-through port 150 in the second integrated test apparatus 901 is positioned on the electromagnetically-isolating external wall of the internal device testing chamber 340 such that the auxiliary test instrument 400 in the first integrated test apparatus 800 is in electrical communication with the auxiliary test instrument 400 in the second integrated test apparatus 901. It is noted that the auxiliary test instruments 400 in each integrated test apparatus 800, 901 can be the same as or different than each other.

Figure 11:
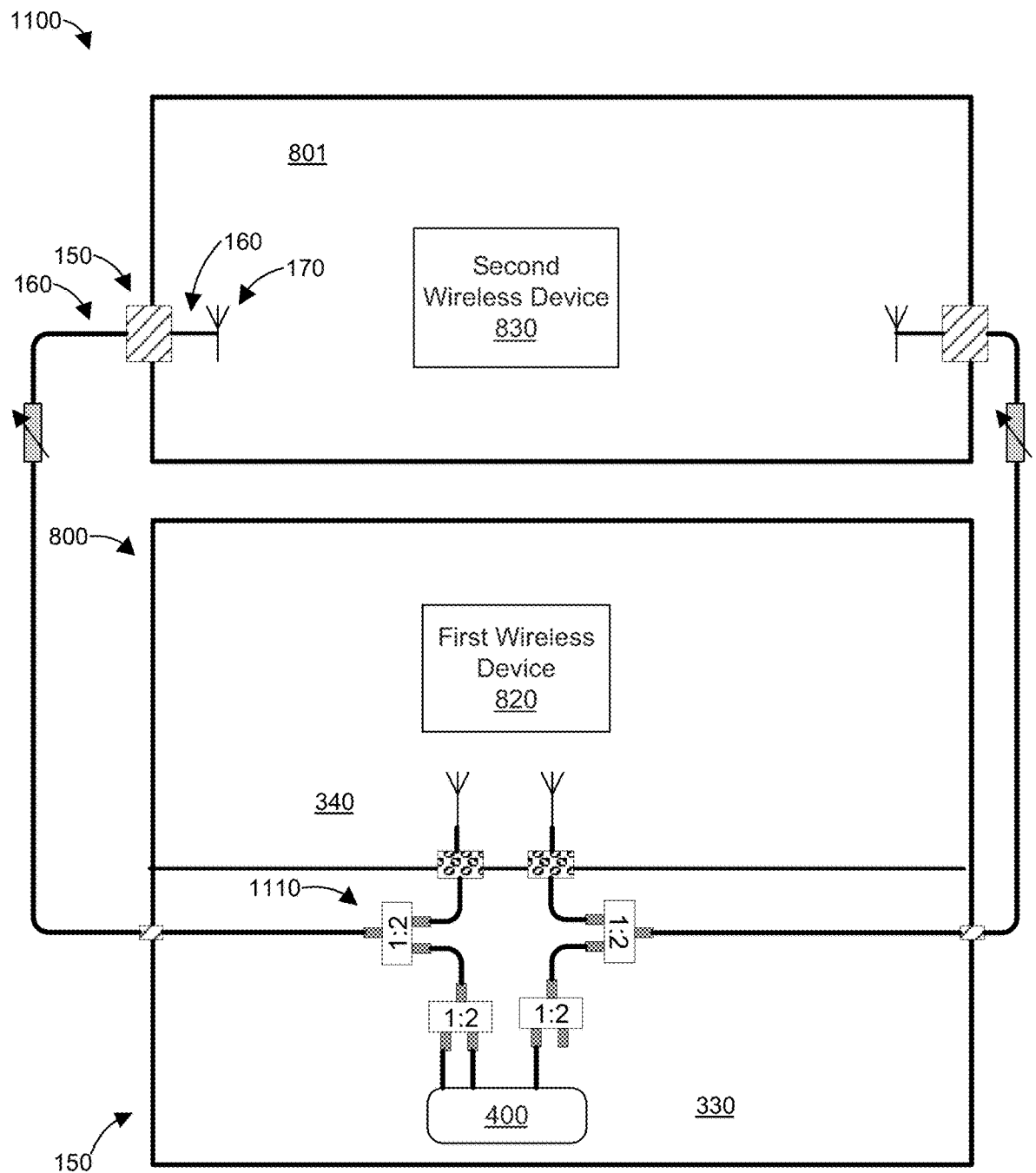
FIG. 11 is a block diagram of a system for testing wireless devices according to another alternative embodiment.

FIG. 11 is a block diagram of a system 1100 for testing wireless devices according to another embodiment. System 1100 is the same as system 80 except that the auxiliary test instrument 400 is coupled to multiple splitter and combiners 1110 to provide additional internal and external communication paths to the first and second wireless devices 820, 830, respectively. Programmable attenuators 1120 are optionally coupled to the external communication paths to provide signal attenuation, to emulate fading, and/or to emulate a multipath RF environment.

Figure 13:
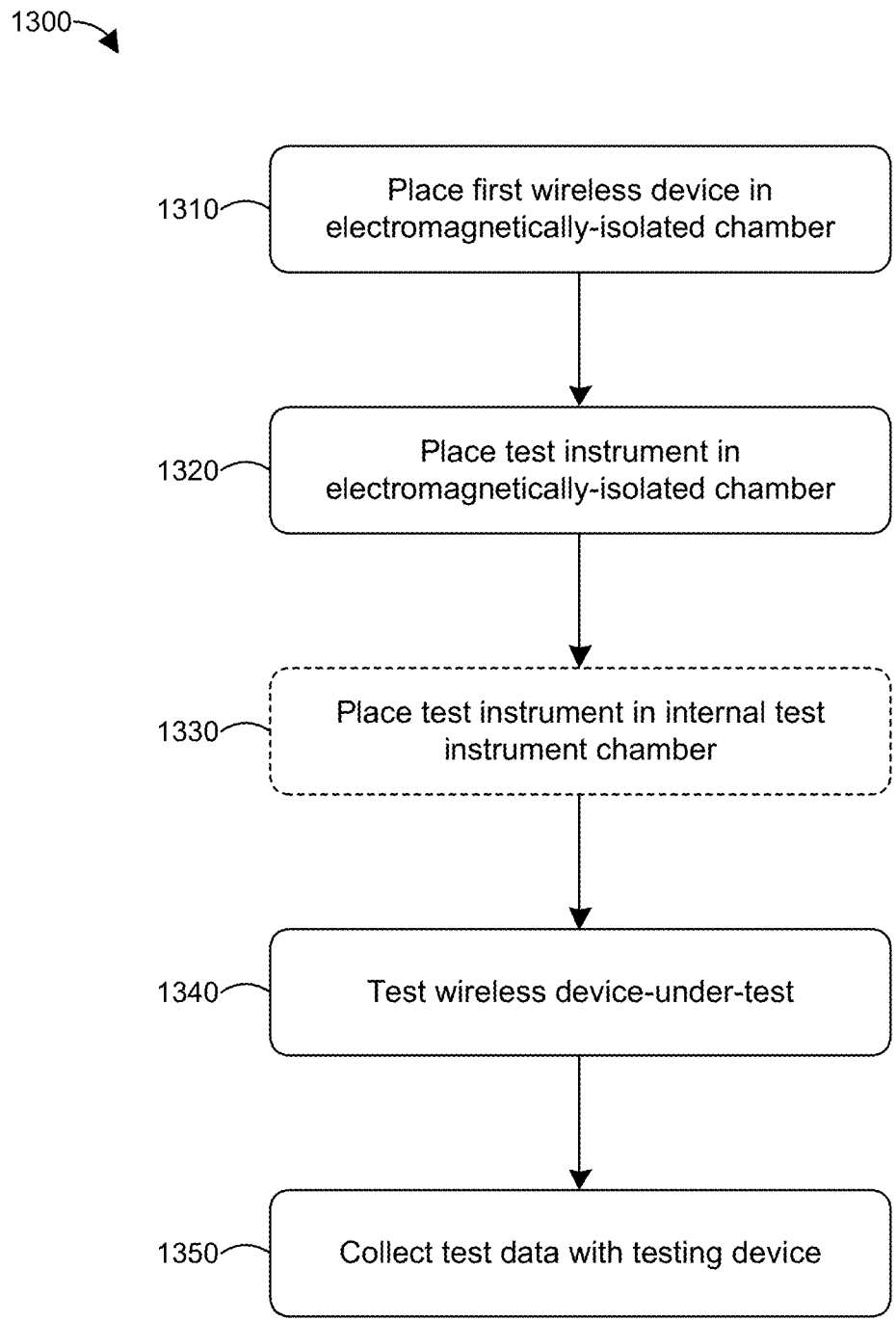
FIG. 13 is a flow chart of a method for testing wireless devices according to one or more embodiments.

FIG. 13 is a flow chart 1300 of a method for testing wireless devices according to one or more embodiments. In step 1310, a first wireless device is placed in an electromagnetically-isolated chamber having electromagnetically-isolating external walls. The first wireless device can be a DUT (e.g., DUT 110), a client device, an access point, or an end point. In step 1320, an auxiliary test instrument (e.g., auxiliary test instrument 400) is placed in the electromagnetically-isolated chamber.

In optional step 1330, the auxiliary test instrument is placed in an internal test instrument chamber (e.g., internal test instrument chamber 330) within the electromagnetically-isolated chamber. The internal test instrument chamber is defined by at least one internal wall or a combination of one or more internal walls and one or more of the electromagnetically-isolating external walls. In one example, the internal test instrument chamber can be accessed by removing or detaching the internal wall (e.g., from another internal wall or from one or more of the electromagnetically-isolating external walls to which the internal wall is attached) and then replacing or re-attaching the internal wall after the auxiliary test instrument is placed in the internal test instrument chamber. In another example, the internal test instrument chamber can be accessed by opening an access door to the internal test instrument chamber. The access door can be located on an internal wall or on one of the electromagnetically-isolating external walls. When the access door is located on one of the electromagnetically-isolating external walls, the access door can be electromagnetically-isolating. For example, the access door and the electromagnetically-isolating external walls can comprise the same material(s).

In step 1340, a DUT is tested in the electromagnetically-isolated chamber or in another electromagnetically-isolated chamber. If the first wireless device is not the DUT, the first wireless device is in electrical communication with the DUT via an RF feed-through port on one of the electromagnetically-isolating external walls of each electromagnetically-isolated chamber (e.g., via an antenna in each chamber and an RF cable that connects the antennas via the feed-through ports). The test can comprise: (a) RvR (data rate-vs-range), (b) RvR with rotation if a turntable is included, (c) RvRvO (data rate-vs-range-vs-orientation) or RvOvR (data rate-vs-orientation-vs-range) if a turntable is included in the electromagnetically-isolated chamber, (d) band steering, (e) packet capture, and/or (f) another wireless test. In step 1350, test data is collected by the auxiliary test instrument for the first wireless device during the testing in step 1340.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

What is claimed is:

1. An apparatus for testing wireless devices, comprising:
electromagnetically-isolating external walls that define a chamber;
an internal wall attached to one or more of the electromagnetically-isolating external walls to form an internal test instrument chamber and an internal device testing chamber; and
an internal RF feed-through port that passes through the internal wall to electrically couple a test instrument disposed in the internal test instrument chamber to a wireless device-under-test (DUT) disposed in the internal device testing chamber,
wherein the test instrument is electrically coupled to an external RF feed-through port that passes through one of the electromagnetically-isolating external walls on a perimeter of the internal test instrument chamber to electrically couple the test instrument to a second wireless device.

2. The apparatus of claim 1, further comprising an external RF feed-through port that passes through one of the electromagnetically-isolating external walls to electrically couple the DUT to a second wireless device.

3. The apparatus of claim 2, wherein the external RF feed-through port is disposed on a perimeter of the internal device testing chamber.

4. The apparatus of claim 1, wherein the electromagnetically-isolating external walls comprise an electrically-conductive material.

5. The apparatus of claim 4, wherein the electrically-conductive material comprises steel.

6. The apparatus of claim 1, wherein the internal and external RF feed-through ports are electrically coupled to respective antennas in the internal device testing chamber.

7. The apparatus of claim 1, wherein the test instrument comprises a packet sniffer.

8. The apparatus of claim 1, wherein the test instrument comprises a traffic endpoint.

9. The apparatus of claim 1, wherein the test instrument comprises an RF interference generator.

10. The apparatus of claim 1, further comprising an access door disposed on one of the electromagnetically-isolating external walls.

11. The apparatus of claim 1, wherein the internal wall is electromagnetically-isolating.

12. The apparatus of claim 1, wherein an RF absorber is disposed on interior surfaces of the internal device testing chamber.

13. The apparatus of claim 1, wherein the internal wall is detachably attached to the one or more of the electromagnetically-isolating external walls.

14. A system for testing wireless devices, comprising:
a first apparatus comprising:
first electromagnetically-isolating external walls that define a first chamber;
an internal wall attached to one or more of the first electromagnetically-isolating external walls to form an internal test instrument chamber and an internal device testing chamber;
an internal wall RF feed-through port that passes through the internal wall to electrically couple a test instrument disposed in the internal test instrument chamber to a first wireless device disposed in the internal device testing chamber; and
a first external wall RF feed-through port that passes through one of the electromagnetically-isolating external walls on a perimeter of the internal test instrument chamber;
a second apparatus comprising:
second electromagnetically-isolating external walls that define a second chamber; and
a second external wall RF feed-through port that passes through one of the second electromagnetically-isolating external walls, wherein:
the test instrument is in electrical communication with the first wireless device via the internal wall RF feed-through port, and
the test instrument is in electrical communication with a second wireless device in the second chamber via the first and second external wall RF feed-through ports.

15. The system of claim 14, wherein the second apparatus includes a second internal wall attached to one or more of the second electromagnetically-isolating external walls to form a second internal test instrument chamber and a second internal device testing chamber.

16. The system of claim 14, wherein the test instrument is electrically coupled to the internal wall RF feed-through port and to the first external wall RF feed-through port via a combiner.

17. The system of claim 14, wherein the electromagnetically-isolating external walls comprise an electrically-conductive material.

18. The system of claim 17, wherein the electrically-conductive material comprises steel.

19. The system of claim 14, wherein the internal wall RF feed-through port is electrically coupled to an antenna in the internal device testing chamber.

20. The system of claim 14, wherein the test instrument comprises a packet sniffer.

21. The system of claim 14, wherein the test instrument comprises a traffic endpoint.

22. The system of claim 14, wherein the test instrument comprises an RF interference generator.

23. The system of claim 14, wherein the internal wall is electromagnetically-isolating.

24. The system of claim 14, wherein an RF absorber is disposed on interior surfaces of the internal device testing chamber and on interior surfaces of the second electromagnetically-isolating external walls.

25. The system of claim 14, wherein the internal wall is detachably attached to the one or more of the first electromagnetically-isolating external walls.

26. The system of claim 14, wherein an electrically-shielded coaxial cable extends between the first and second external wall RF feed-through ports.

27. The system of claim 26, wherein the electrically-shielded coaxial cable is electrically coupled to a programmable attenuator.

28. A method of wireless device testing comprising:
placing a first wireless device in a chamber having electromagnetically-isolating external walls;
placing a testing device in the chamber;
testing a wireless device-under-test (DUT), wherein the DUT is in electrical communication with the first wireless device or the DUT comprises the first wireless device;
collecting test data with the testing device, the test data corresponding to wireless signals sent to and/or from the first wireless device during the testing; and
placing the testing device in an internal test instrument chamber defined by an internal wall attached to one or more of the electromagnetically-isolating external walls.

29. The method of claim 28, further comprising, prior to placing the testing device in the internal test instrument chamber, removing the internal wall to access the internal test instrument chamber.

30. The method of claim 28, further comprising, prior to placing the testing device in the internal test instrument chamber, opening an access door to access the internal test instrument chamber, the access door disposed on the internal wall or the one or more of the electromagnetically-isolating external walls.

31. The method of claim 28, wherein the first wireless device comprises the DUT.

32. The method of claim 28, wherein the DUT is located in a second chamber having electromagnetically-isolating external walls.

* * * * *